(12) United States Patent
Knickerbocker et al.

(10) Patent No.: US 6,790,515 B2
(45) Date of Patent: Sep. 14, 2004

(54) GREENSHEET CARRIERS AND PROCESSING THEREOF

(75) Inventors: John U. Knickerbocker, Hopewell Junction, NY (US); Govindarajan Natarajan, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/411,906

(22) Filed: Apr. 11, 2003

(65) Prior Publication Data

US 2003/0203175 A1 Oct. 30, 2003

Related U.S. Application Data

(62) Division of application No. 09/757,071, filed on Jan. 8, 2001, now Pat. No. 6,607,620.

(51) Int. Cl.$^7$ .............................. B32B 3/00; H01B 17/00
(52) U.S. Cl. .................. 428/210; 174/138 G; 174/148; 174/163 R; 174/167
(58) Field of Search ......................................... 428/210

(56) References Cited

U.S. PATENT DOCUMENTS

| | | | |
|---|---|---|---|
| 3,879,509 A | | 4/1975 | Elderbaum |
| 4,115,839 A | * | 9/1978 | Hummel ...................... 361/393 |
| 4,497,677 A | | 2/1985 | Sanada et al. |
| 4,677,254 A | | 6/1987 | Boss et al. |
| 4,802,945 A | | 2/1989 | Opina |
| 5,489,465 A | * | 2/1996 | Natarajan et al. ........... 428/210 |
| 5,866,470 A | | 2/1999 | Casey et al. |
| 5,927,193 A | | 7/1999 | Balz et al. |

FOREIGN PATENT DOCUMENTS

| | | |
|---|---|---|
| JP | 60073291 A | 9/1983 |
| JP | 59-056747 | 4/1984 |
| JP | 61124120 A | 11/1984 |
| JP | 03-088389 | 2/1991 |
| JP | 03-069188 | 3/1991 |
| JP | 03-116895 | 5/1991 |
| JP | 04-201512 | 7/1992 |
| JP | 04-364013 | 12/1992 |
| JP | 06-252561 | 9/1994 |
| JP | 06-270123 | 9/1994 |
| JP | 09-036547 | 2/1997 |
| JP | 10-065345 | 3/1998 |

* cited by examiner

*Primary Examiner*—Cathy F. Lam
(74) *Attorney, Agent, or Firm*—DeLio & Peterson, LLC; Peter W. Peterson; Ira D. Blecker, Esq.

(57) ABSTRACT

A method of processing greensheets for use as microelectronic substrates comprises providing a greensheet having a width, a length and a thickness, bonding to the greensheet, within the greensheet width and length, a frame adapted to constrain movement of the greensheet within the frame, processing the greensheet and bonded frame, and removing the frame from the processed greensheet. The processing of the greensheet and bonded frame may include punching vias in the greensheet, filling the vias in the greensheet with conductive material, patterning the greensheet by applying conductive paste to the vias and greensheet surface, stacking the patterned greensheet and bonded frame with at least one other patterned greensheet and bonded frame, and laminating the greensheets. The frame is preferably removed from the processed greensheet after laminating the greensheets, and before the laminated greensheets are subsequently sintered. The bonding of the frame to the greensheet may be by lamination or by an adhesive, or by other means. Preferably, the frame has a thickness less than the greensheet thickness. The frame preferably has a plurality of members subdividing the greensheet into a plurality of areas, with each area being completely surrounded by frame members. The frame may be applied to one side of the greensheet, and pressed into the greensheet side such that the frame and greensheet side are substantially coplanar.

22 Claims, 3 Drawing Sheets

GREENSHEET CARRIERS AND PROCESSING THEREOF

This is a divisional of application Ser. No. 09/757,071 filed on Jan. 8, 2001, now U.S. Pat. No. 6,607,620 issued Aug. 19, 2003.

BACKGROUND OF THE INVENTION

1. Field of the Invention

The present invention relates generally to processing of greensheets used to make ceramic substrates for microelectronic components.

2. Description of Related Art

In the ceramic electronics industry, multilayer ceramic (MLC) technology is typically used to create three-dimensional circuitry in ceramic substrates for microelectronic devices such as integrated circuits and ceramic capacitors. The three-dimensional circuitry in the ceramic substrate is made by applying a conductive material in a circuit pattern on a ceramic/polymer composite sheet. The ceramic/polymer composite sheet is known as a "greensheet" and may have a number of via holes punched in it to allow vertical connection between the conductive material on adjacent sheets. After the vias are punched, the greensheets are screened and patterned by applying a conductive paste into the via holes and along the surface of the greensheet. The screening is typically done utilizing a mask applied over the individual greensheet. The greensheets are then generally stacked in a designated order and laminated together under appropriate heat and pressure to form a laminate which can be handled as a unified structure. To produce the final ceramic material, the laminated ceramic/polymer composite is fired, i.e. heated, to remove the polymer, followed by heating to higher temperature to sinter and densify the ceramic.

MLC technology has developed to incorporate advanced technologies and groundrules, i.e., triple dense conductors, thin green sheets and large area greensheets. However, in the course of adopting such new technologies, greensheet stability has become a concern. In particular, radial error of the through holes can and does contribute to misalignment of the conductive vias and other features. The use of one or more of these advanced technologies in a multilayer package, where the individually punched and screened sheets are stacked adjacent to each other to form the laminate, is possible only if the via holes can be punched and screened with a small radial error. It would be especially desirable if this radial error were less than 30 microns.

Bearing in mind the problems and deficiencies of the prior art, it is therefore an object of the present invention to provide an improved via-punched and screened greensheet for use with advanced groundrules, thin green sheets and large area greensheets.

It is another object of the present invention to provide an improved greensheet and processing method which reduces radial error of the screened greensheet.

A further object of the invention is to provide a process and system to make greensheet via alignment more precise in stacked greensheet laminates.

SUMMARY OF THE INVENTION

The above and other objects and advantages, which will be apparent to one of skill in the art, are achieved in the present invention which is directed to, in a first aspect, a method of processing greensheets for use as microelectronic substrates comprising providing a greensheet having a width, a length and a thickness, bonding to the greensheet, within the greensheet width and length, a frame adapted to constrain movement of the greensheet within the frame, processing the greensheet and bonded frame, and removing the frame from the processed greensheet. The processing of the greensheet and bonded frame may include punching vias in the greensheet, filling the vias in the greensheet with conductive material, patterning the greensheet by applying conductive paste to the vias and greensheet surface, stacking the patterned greensheet and bonded frame with at least one other patterned greensheet and bonded frame, and laminating the greensheets. The frame is preferably removed from the processed greensheet after laminating the greensheets, and before the laminated greensheets are subsequently sintered.

In another aspect, the present invention provides a method of processing greensheets for use as microelectronic substrates comprising providing a greensheet having at least one active area, bonding to the greensheet a frame that completely surrounds the active area, the frame adapted to constrain movement of the at least one active area within the frame, processing the greensheet and bonded frame, and removing the frame from the processed greensheet. The greensheet may have a plurality of active areas and the frame may comprise a plurality of subframes such that each of the subframes surrounds one of the plurality of active areas.

In a further aspect, the present invention provides a greensheet having a width, a length and a thickness and a frame bonded to the greensheet within the greensheet width and length. The frame is adapted to constrain movement of the greensheet within the frame.

The bonding of the frame to the greensheet may be by lamination or by an adhesive, or by other means. Preferably, the frame has a thickness less than the greensheet thickness.

The frame preferably has a plurality of members subdividing the greensheet into a plurality of areas, with each area being completely surrounded by frame members. The frame may be applied to one side of the greensheet, and pressed into the greensheet side such that that the frame and greensheet side are substantially coplanar. The entire frame may be bonded within the width and length of the greensheet.

The frame may comprise a material selected from the group consisting essentially of metals, polymers, ceramics, cellulosics, and composites of the above. The metal may be molybdenum, stainless steel, nickel, titanium, tungsten and/or aluminum. The frame is preferably made of a material substantially resistant to movement during the processing of the greensheet and bonded frame. The frame may additionally contain an opening to constrain a via in the greensheet.

The present invention also provides a greensheet laminate stack comprising a plurality of the previously described frame and greensheet combinations, with the plurality the greensheets being stacked and laminated.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
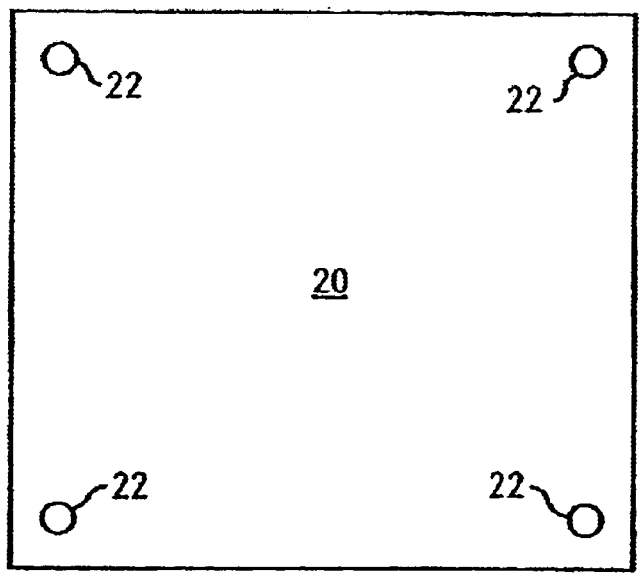
FIG. 1 is a top plan view of a ceramic/polymer greensheet to be processed for use as a microelectronic substrate.

In describing the preferred embodiment of the present invention, reference will be made herein to FIGS. 1–8 of the drawings in which like numerals refer to like features of the invention. Features of the invention are not necessarily shown to scale in the drawings.

The present invention provides a method of processing greensheets with frames to strengthen the greensheets during processing and, more importantly, to constrain movement, including shrinkage, of the greensheet within the frame area during punching, screening, drying, stacking, and laminating. The instant invention uses what are termed 'up constrained' frames which are bonded to greensheets before punching and screening. The present invention permits punching and screening of the greensheets in the usual manner, i.e., preferably individually. After stacking and lamination, the edge frames are cut away.

Figure 2:
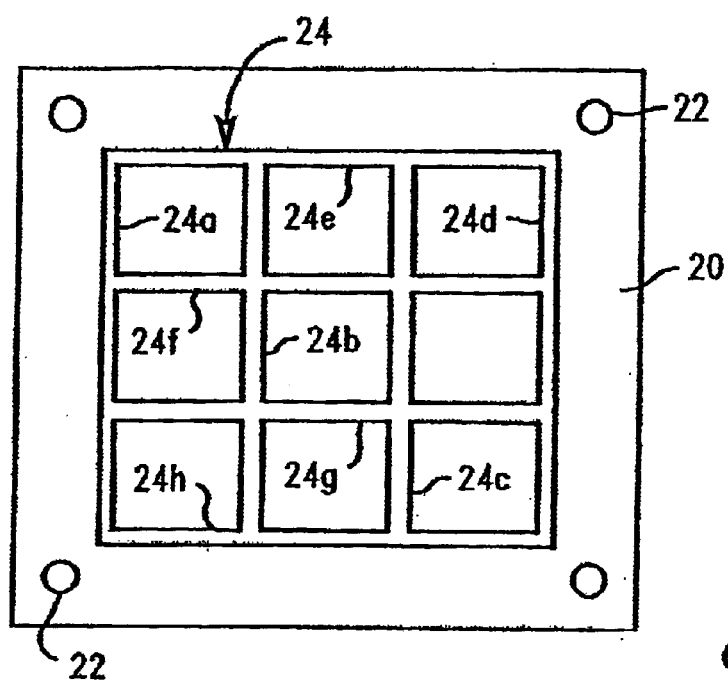
FIG. 2 is top plan view of the greensheet of FIG. 1 with the frame of the present invention overlaid and bonded on the greensheet top surface.
Figure 2A:
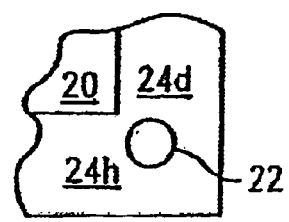
FIG. 2a is an enlargement of a corner portion of the greensheet of FIG. 2, showing an alternate embodiment where the frame extends completely to the edge of the greensheet.

A typical greensheet 20 is shown in FIG. 1 having locator holes 22 formed therein to secure the greensheet during subsequent processing. The greensheet is generally rectangular (square) and has a planar upper and lower surface. In FIG. 2 and FIG. 2a, there is shown the preferred frame of the present invention overlaying and bonded to the upper surface of greensheet 20. Frame 24 is bonded within the greensheet width and length, preferably entirely within the greensheet width and length, leaving a portion of the greensheet edge outside of the frame. As shown in FIG. 2, frame 24 preferably comprises a plurality of parallel thin members 24a, 24b, 24c, 24d arranged in vertical orientation and similar parallel, thin members 24e, 24f, 24g and 24h arranged in horizontal orientation, so that the vertical and horizontal members are perpendicular to each other. These members create a grid of subframes which forms at least one active area, and preferably a plurality of active areas, within the greensheet, with each area completely bounded or surrounded by a frame member. The active areas may be of any desired size. Preferably, the frame is made from a unitary sheet of material which is stamped or otherwise cut to create the structure shown, for example, the three-by-three greensheet area structure shown in FIG. 2. The constraint provided by the frame may be extended even to via size openings to constrain some or all of the vias in the greensheet. For example, a 0.004 in. diameter hole in a frame member may be used to constrain a 0.003 in. diameter via formed in the greensheet inside the frame opening.

FIG. 2a is an enlargement of a corner portion of the greensheet of FIG. 2, showing an alternate embodiment where the frame extends completely to the edge of the greensheet. The frame also includes an opening for the locator holes 22, and protects the locator hole from damage.

The preferred materials for the frame are any suitable metal, polymer, ceramic, cellulosic (i.e. cellulosed based paper or wood product), or composites including any of the above materials. The preferred materials should be substantially resistant to movement, e.g., warping, shrinkage and the like, during processing of the greensheet and frame, as subsequently described. Preferred metals to be used are molybdenum, stainless steel, nickel, titanium, tungsten and aluminum. More preferably, a nickel frame is used for glass-ceramic or alumina-magnesia-silicate based ceramic greensheets, a molybdenum frame is used for alumina greensheets, and a tungsten frame is used for aluminum nitride greensheets. Preferred polymers include polyethylene naphthalate (PEN), polyester and polyethylene. Preferred ceramics include glass, including glass fibers, or other greensheet ceramic materials having higher strength then the greensheet on which the frame is applied. The frame 24 is bonded to at least one surface of the greensheet 20.

Figure 3:
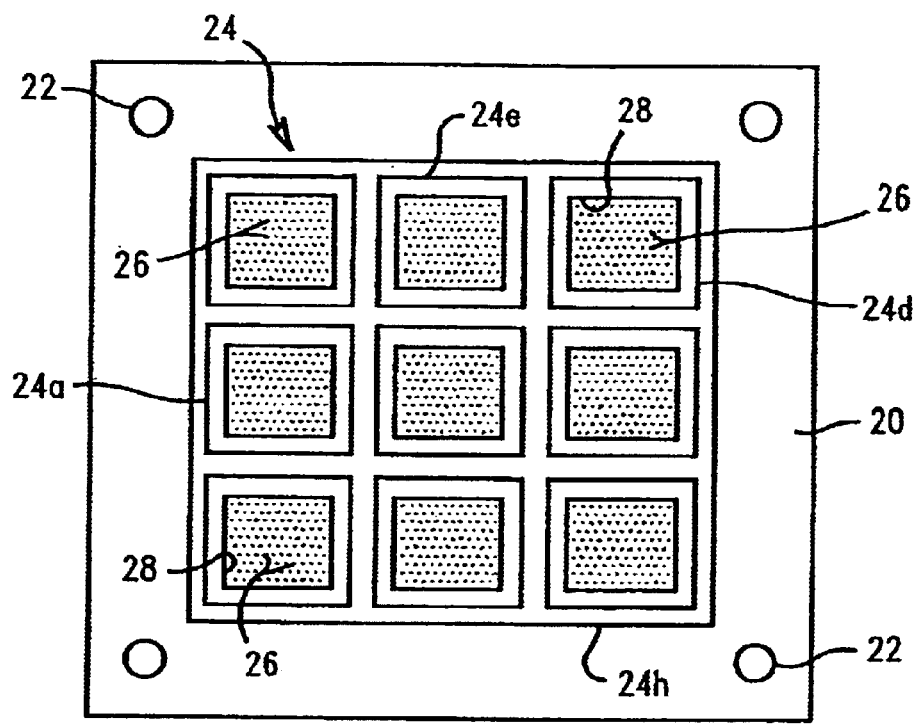
FIG. 3 is top plan view of the greensheet and bonded frame of FIG. 2, with via holes punched into areas between the frame members.
Figure 4:
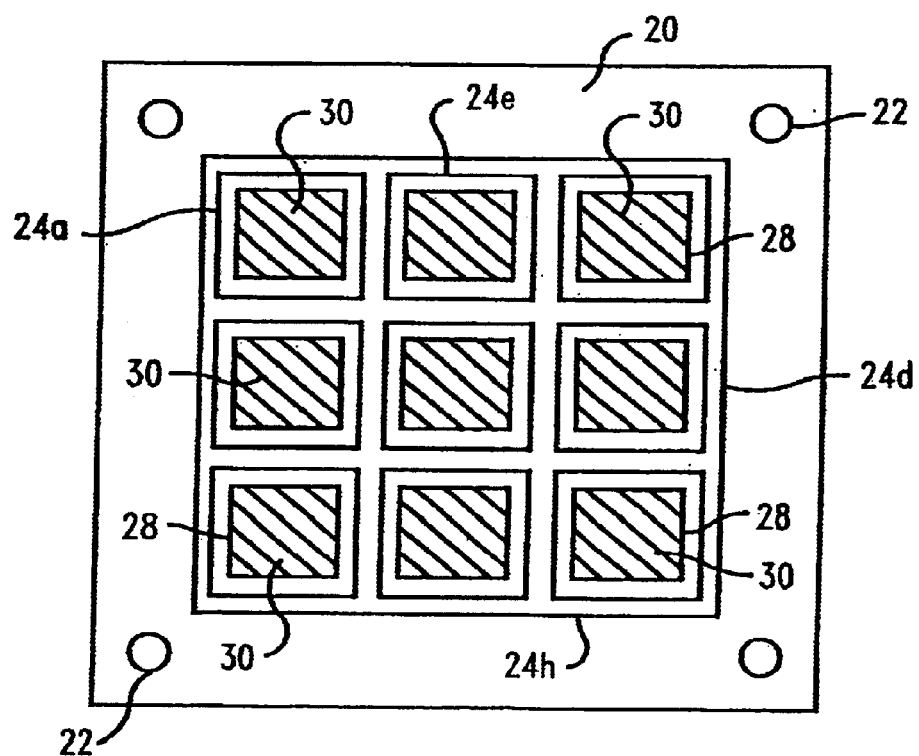
FIG. 4 is top plan view of the greensheet and bonded frame of FIG. 3, with conductive paste screened over the via areas between the frame members.

Subsequent processing of the greensheet is shown in FIGS. 3–6. In FIG. 3, a plurality of vias 26 are punched through the greensheet in identified areas 28 bounded by the individual frame members. Subsequently, as shown in FIG. 4, the areas 28 within the frame members are screened and patterned by applying conductive paste 30 into the vias and onto the surface as desired, to form the conductive lines and vias after sintering.

Figure 5:
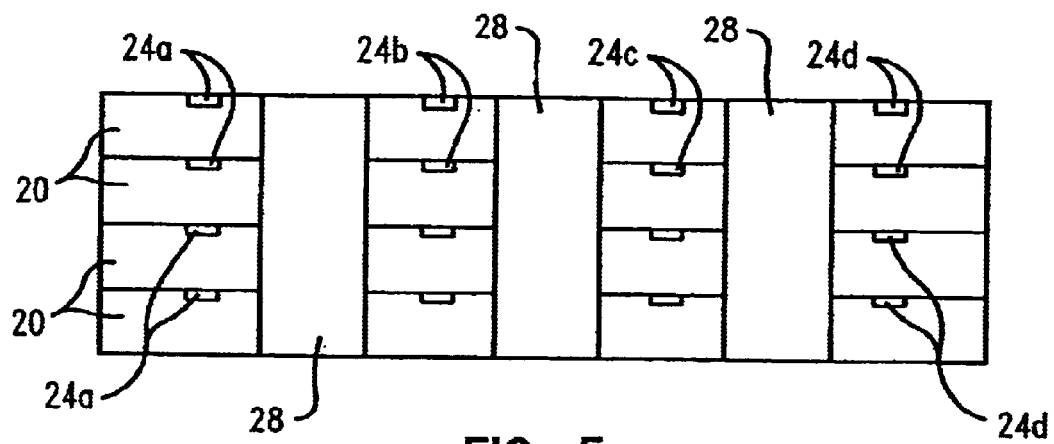
FIG. 5 is a vertical elevational view of a cross section of a plurality of the screened and patterned greensheets with bonded frame of FIG. 4 stacked for laminating.
Figure 6:
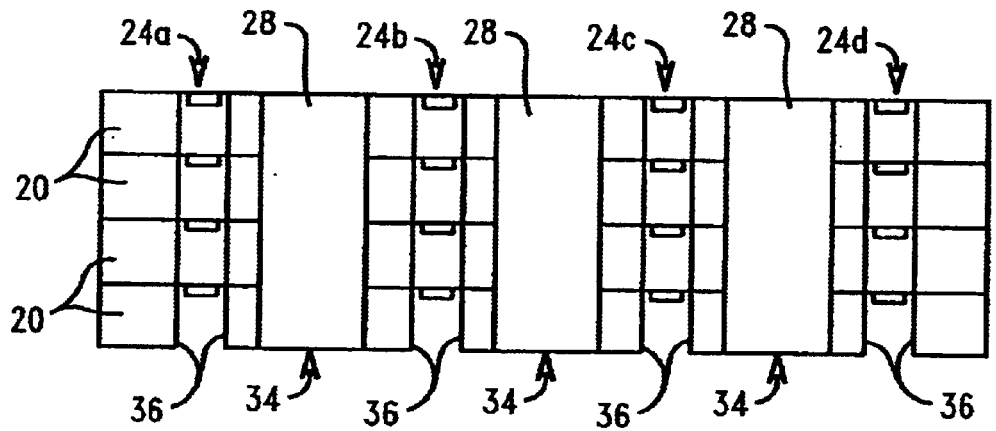
FIG. 6 is an elevational view of a cross section of the stacked greensheet laminate of FIG. 5, showing the cut lines to remove the frame members.

A plurality of such greensheets and bonded frames are then stacked and laminated as shown in FIG. 5. In the course of stacking the greensheets to form the laminate, the via holes in each of the greensheet layers 20 are suitably aligned to the desired via hole in the adjacent sheet so that the proper contact is made between ceramic layers in the laminate. After stacking and lamination, but before sintering, the frame members are cut away in green sizing to produce a plurality of the stacked MLC segments 20. As shown in FIG. 6, cut lines 36 show removal by saw blading of the individual frame members 24a, 24b, etc. so that final MLC product 34 contains no framed material. Saw blades or laser cutting may be used to cut the green sized laminate. Alternatively, the frame may be cut away after sintering of the laminate. The laminate is then subject to heating to remove the polymer from the ceramic/polymer greensheet, followed by heating to a temperature suitable to sinter and densify the ceramic material used in the greensheets 20.

Figure 7:
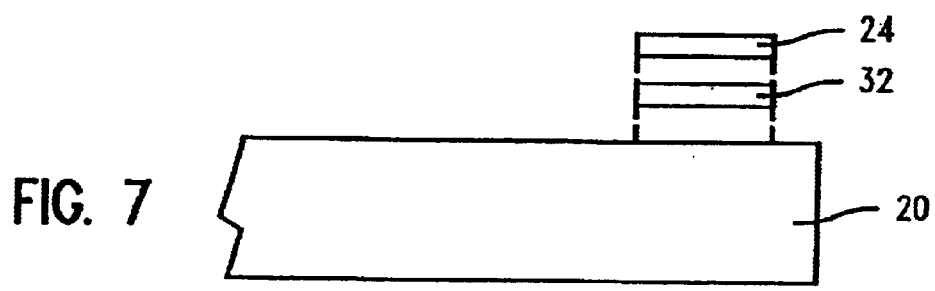
FIG. 7 is a vertical sectional view near the edge of a single greensheet showing application of a frame member.
Figure 8:
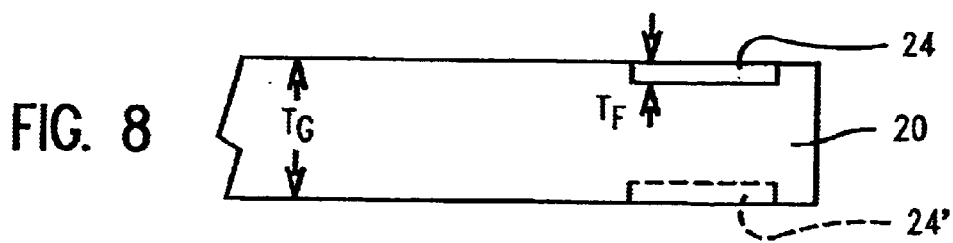
FIG. 8 is a vertical sectional view of the greensheet of FIG. 7 after the frame member has been bonded to the greensheet.

The frame members may be laminated or adhered to the surface of the individual greensheets. As shown in FIG. 7, frame 24 is disposed over the surface of greensheet 20 and pressed down, optionally using an adhesive layer 32. As shown in FIG. 8, the frame 24 is pressed into the surface of greensheet 20 such that the upper frame surface and the upper greensheet surface are substantially co-planar. It is greatly preferred that the greensheet have a minimum surface roughness of at least about 500 Å and less than about 4000 Å, more preferably the surface roughness is in the range of about 2000 to 4000 Å. This ensures that there is proper adhesion during mounting the frame to the individual greensheets (FIGS. 7 and 8). Optionally, additional frame member 24' may be applied to the opposite surface of greensheet 20. The frame thickness $T_F$ is preferably substantially thinner than the greensheet thickness $T_G$. For example, the greensheet thickness may range from 0.001 inches to 0.006 inches, while the frame thickness may range from less than 0.001 inches to 0.005 inches. Preferably, the frame thickness ranges from about 0.0005 to 0.001 in. in thickness. Whether laminated or using an adhesive, it is important that the frame be of sufficient strength and adequately bonded to the greensheet material to prevent substantial movement of the location of the individual vias within the greensheet during processing. It is also preferred that the coefficient of thermal expansion of the frame material matches that of the greensheet as closely as possible, with a minimum difference.

Alternatively, the greensheets may be individually processed without the frames (i.e., punched and screened) and then stacked, with frames then being provided between selected pairs of the greensheets. The stacked greensheets and frames may then be laminated, and the frames subsequently cut away.

Tests of the present invention have shown dramatic improvement in reducing maximum radial error. Such tests have shown maximum radial error as low as 8 to 10 microns is possible using the present invention at the end of personalization processes.

Tests were made of greensheets with molybdenum frames having nine openings, to make 9 substrates. These frames were about 0.9 mil, thick with member width as small as 0.5 mm. Molybdenum frames are generally preferred when alumina based greensheets are processed. The alumina based greensheets tested were of 2 mil, 3 mil and 6 mil thickness. The conductor metal in the paste was molybdenum based. The features screened were vias, caps, pads and lines with groundrules as tight as 2.5 mil vias on 7 mil grid and a line in between. The metal loading was as high as 44% screened. It was found that the radial error when the frames were not used were beyond measurable in thin sheets, and sheets themselves were wrinkled and were not usable. In contrast, the frame supported sheets gave radial errors less than 30 microns and, more importantly, the pattern expansion was very close to zero percent.

Tests were also made of greensheets having nickel frames with nine openings, to make nine substrates. These frames were about 0.7 mil thick with member width as small as 0.25 mm. Nickel frames are generally preferred when glass ceramic (alumino-magnesium-silicate ceramics) based greensheets are processed. The glass ceramic based greensheets tested were of 2 mil, 4 mil and 6 mil thickness. The conductor metal in the paste was copper based. The features screened were vias, caps, pads and lines with groundrules as tight as 2.5 mil vias on 7 mil grid and a line in between. The metal loading was as high as 38% screened. It was found that the radial error when the frames were not used were beyond measurable in thin sheets, and sheets themselves were wrinkled and were not usable. In contrast, the frame supported sheets gave radial errors less than 30 microns and, more importantly, the pattern expansion was very close to zero percent.

Greensheets were also tested with one, four, nine and sixteen openings in the frames. All gave consistently better results than no frames. Several other frame materials were also tested, such as molyperm (a Mo—Ni alloy), paper which is coated or uncoated, and the like, and the results depended on the base greensheet material, surface roughness of the frame and CTE (coefficient of expansion) of the frame material in comparison to the greensheet material.

Using the above, multilayer laminates/substrates were built with all layers having 2 and/or 3 mil greensheet thicknesses, and having layer counts up to 18. Good electrical yields were consistently achieved.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A greensheet comprising:
   a greensheet having a width, a length and a thickness; and
   a frame bonded to the greensheet within the greensheet width and length, wherein at least a portion of an edge of the greensheet extends outside of the frame, the frame being adapted to constrain movement of the greensheet within the frame.

2. The greensheet of claim 1 wherein the frame is laminated to the greensheet.

3. The greensheet of claim 1 wherein the frame is bonded to the greensheet by an adhesive.

4. The greensheet of claim 1 wherein the frame has a thickness less than the greensheet thickness.

5. The greensheet of claim 1 wherein the entire frame is bonded within the width and length of the green sheet.

6. The greensheet of claim 1 wherein the frame comprises a material selected from the group consisting essentially of metals, polymers, ceramics, cellulosics, and composites of the above.

7. The greensheet of claim 1 wherein the frame comprises a material substantially resistant to movement during the processing of the greensheet and bonded frame.

8. The greensheet of claim 1 wherein the greensheet has a locator hole through the thickness thereof and the frame has an opening therein corresponding to and protecting the greensheet locator hole.

9. A greensheet comprising:
   a greensheet having a width, a length and a thickness;
   a frame bonded to the greensheet entirely within the greensheet width and length, the frame having a thickness less than the greensheet thickness and being adapted to constrain movement of the greensheet within the frame, the frame having a plurality of members subdividing the greensheet into a plurality of areas, each area being completely surrounded by frame members.

10. The greensheet of claim 9 wherein the frame is laminated to the greensheet.

11. The greensheet of claim 9 wherein the frame is bonded to the greensheet by an adhesive.

12. The greensheet of clam 9 wherein the frame is applied to one side of the greensheet, and wherein the frame is pressed into the greensheet side such that that the frame and greensheet side are substantially coplanar.

13. The greensheet of claim 9 wherein the frame contains a locator hole for the greensheet.

14. A greensheet laminate stack comprising a plurality of the greensheets of claim 9, the greensheets being stacked and laminated.

15. The greensheet of claim 9 wherein at least a portion of an edge of the greensheet extends outside of the frame.

16. The greensheet of claim 9 wherein the greensheet has a locator hole near an edge thereof, and the frame is bonded to the greensheet such that the locator hole is outside of the frame.

17. The greensheet of claim 9 wherein the greensheet has a locator hole through the thickness thereof and the frame has an opening therein corresponding to and protecting the greensheet locator hole.

18. A greensheet comprising:

a greensheet having a width, a length and a thickness; and a frame bonded to the greensheet within the greensheet width and length, wherein the frame has a plurality of members subdividing the greensheet into a plurality of areas, each area being completely surrounded by frame members, the frame being adapted to constrain movement of the greensheet within the frame.

19. A greensheet comprising:

a greensheet having a width, a length and a thickness; and a frame bonded to the greensheet within the greensheet width and length, wherein the frame is applied to one side of the greensheet, and wherein the frame is pressed into the greensheet side such that the frame and greensheet side are substantially coplanar, the frame being adapted to constrain movement of the greensheet within the frame.

20. A greensheet laminate stack comprising a plurality of greensheets, each greensheet having a width, a length and a thickness, and a frame bonded to each greensheet within the greensheet width and length, the frame being adapted to constrain movement of the greensheet within the frame, wherein at least a portion of an edge of each greensheet extends outside of the frame, the greensheets being stacked and laminated.

21. A greensheet having a width, a length and a thickness, and a frame bonded to the greensheet within the greensheet width and length, the being adapted to constrain movement of the greensheet within the frame, wherein at least a portion of an edge of the greensheet extends outside of the frame, and wherein the frame has a thickness less than the thickness of the greensheet.

22. A greensheet having a width, a length and a thickness, and a frame bonded to the greensheet within the greensheet width and length, the frame being adapted to constrain movement of the greensheet within the frame, and wherein the greensheet has a locator hole near an edge thereof, and the frame is bonded to the greensheet such that the locator hole is outside of the frame.

\* \* \* \* \*